(12) United States Patent
Zhao

(10) Patent No.: US 11,112,231 B2
(45) Date of Patent: Sep. 7, 2021

(54) INTEGRATED REFLECTOMETER OR ELLIPSOMETER

(71) Applicant: Applied Materials, Inc., Santa Clara, CA (US)

(72) Inventor: Guoheng Zhao, Palo Alto, CA (US)

(73) Assignee: Applied Materials, Inc., Santa Clara, CA (US)

(*) Notice: Subject to any disclaimer, the term of this patent is extended or adjusted under 35 U.S.C. 154(b) by 114 days.

(21) Appl. No.: 16/672,233

(22) Filed: Nov. 1, 2019

(65) Prior Publication Data

US 2021/0131786 A1    May 6, 2021

(51) Int. Cl.
    *G01B 9/02*          (2006.01)
    *G01M 11/00*       (2006.01)
    *G01N 21/21*        (2006.01)
    *G02B 27/00*        (2006.01)

(52) U.S. Cl.
CPC ..... *G01B 9/02015* (2013.01); *G01M 11/3181* (2013.01); *G01N 21/211* (2013.01); *G02B 27/0025* (2013.01)

(58) Field of Classification Search
CPC ............. G01B 9/02015; G01N 21/211; G01M 11/3181; G02B 27/0025
See application file for complete search history.

(56) References Cited

U.S. PATENT DOCUMENTS

2006/0192958 A1*   8/2006   Harrison ............ G01N 21/9501
                                                  356/328

* cited by examiner

*Primary Examiner* — Hwa Andrew Lee
(74) *Attorney, Agent, or Firm* — Kilpatrick Townsend & Stockton LLP

(57) ABSTRACT

A reflectometer or ellipsometer integrated with a processing tool includes a source module configured to generate a input beam, and a first mirror arranged to receive the input beam. The first mirror is configured to collimate the input beam and direct the input beam toward an aperture plate. The aperture plate has at least two apertures. One of the at least two apertures is arranged to define a measurement beam from a portion of the input beam, and one of the at least two apertures is arranged to define a reference beam from a portion of the input beam. An optical element is arranged within an optical path of the reference beam and outside an optical path of the measurement beam. The optical element is configured to direct the reference beam toward a third mirror. A second mirror is arranged to receive the measurement beam and focus the measurement beam through a window and onto a surface of a sample. The window forms part of a chamber of the processing tool and the sample is disposed within the chamber. At least a portion of the measurement beam is reflected from the surface of the sample as a reflected beam. The second mirror is arranged to receive the reflected beam and direct the reflected beam toward the optical element. The optical element is configured to direct the reflected beam toward the third mirror. The third mirror is arranged to receive the reference beam and the reflected beam and focus the reference beam and the reflected beam onto a collection plane.

20 Claims, 8 Drawing Sheets

INTEGRATED REFLECTOMETER OR ELLIPSOMETER

TECHNICAL FIELD

Embodiments described herein relate generally to reflectometers or ellipsometers and, more particularly, to compact reflectometers or ellipsometers integrated with processing tools.

BACKGROUND

Semiconductor manufacturing process control requires precise measurements of film thickness and pattern critical dimensions (CDs). Spectroscopic reflectometers or ellipsometers have been used for film thickness and pattern CD measurements to provide feedback for process diagnostics and control. Integrating film thickness and pattern CD measurement systems with processing tools is desirable because it reduces time to results and enables measurements that are not possible using stand-alone tools. For example, films that are not stable in air can be measured in a vacuum chamber through a window.

There has been a trend within the semiconductor industry to integrate film thickness and pattern CD measurement tools (metrology tools) with processing tools to provide faster feedback and additional capabilities. However, integrating some metrology tools, such as optical metrology tools, with processing tools has proven to be challenging. Space and footprint limitations lead to compromises in optical performance. Light sources and spectrometers are typically too large and heavy to be useful in an integrated metrology system, and smaller and lighter components are typically less stable and more sensitive to environmental variables. The absence of a vibration isolation platform and precision motion system makes it difficult to achieve high-resolution measurements. Fluctuations in temperature also cause measurement drift. Measurement windows in vacuum chambers must be thick enough to cover a large area, and this tends to degrade optical spot quality and limits the working distance.

Therefore, there is a need for reflectometers or ellipsometers that addresses the above challenges of integrating metrology tools with processing tools, especially for film thickness and CD measurements on patterned samples.

SUMMARY

Embodiments described herein provide compact reflectometers and ellipsometers that can be integrated with processing tools and that can provide precise measurements. A compact reflectometer or ellipsometer may be coupled to a processing tool and configured to measure a property (e.g., film thickness or pattern CD) of a sample disposed within a chamber (e.g., a vacuum chamber) of the processing tool.

In accordance with an embodiment, for example, a reflectometer or ellipsometer integrated with a processing tool includes a source module configured to generate a broadband input beam, and an illumination fiber arranged to receive the broadband input beam and configured to provide an optical path for the broadband input beam. A first mirror is arranged to receive the broadband input beam from the illumination fiber. The first mirror is configured to collimate the broadband input beam and direct the broadband input beam toward an aperture plate. The aperture plate has at least two apertures, one of the at least two apertures arranged to define a measurement beam from the broadband input beam, and one of the at least two apertures arranged to define a reference beam from the broadband input beam. A prism mirror is arranged within an optical path of the reference beam and outside an optical path of the measurement beam. The prism mirror is configured to direct the reference beam toward a third mirror. A second mirror is arranged to receive the measurement beam and focus the measurement beam through a window and onto a surface of a sample. The window forms part of a chamber of the processing tool and the sample is disposed within the chamber. A lens is arranged between the second mirror and the window. The lens is configured to compensate for aberration introduced by the window on the measurement beam. The second mirror focuses the measurement beam onto the surface of the sample at an angle so that at least a portion of the measurement beam is reflected from the surface of the sample as a reflected beam. The reflected beam passes through different portions of the window and the lens than the measurement beam. The second mirror is arranged to receive the reflected beam, and the second mirror is configured to collimate the reflected beam and direct the reflected beam toward the prism mirror. The prism mirror is arranged within an optical path of the reflected beam and configured to direct the reflected beam toward the third mirror. The third mirror is arranged to receive the reference beam and the reflected beam and focus the reference beam and the reflected beam onto a collection fiber. The collection fiber is arranged to receive the reference beam and the reflected beam and provide optical paths for the reference beam and the reflected beam. A detection module is arranged to receive the reference beam and the reflected beam from the collection fiber. The detection module is configured to provide spectral analysis of the reference beam and the reflected beam.

In an embodiment, the first mirror, the second mirror, and the third mirror are each 90° off-axis parabolic mirrors.

In another embodiment, the one of the at least two apertures arranged to define the reference beam is smaller than the one of the at least two apertures arranged to define the measurement beam.

In another embodiment, the reflectometer or ellipsometer integrated with the processing tool also includes an attenuation filter arranged within the optical path of the reference beam to reduce an intensity of the reference beam.

In another embodiment, the reflectometer or ellipsometer integrated with the processing tool also includes a spinning wheel arranged downstream of the aperture plate. The spinning wheel may have alternating slots for allowing the reference beam and the measurement beam to sequentially pass through the spinning wheel.

In another embodiment, the aperture plate has two apertures.

In another embodiment, the at least two apertures of the aperture plate each have an elliptical shape.

In another embodiment, the reference beam and the reflected beam are focused onto a same spot on the collection fiber.

In another embodiment, an output end of the illumination fiber, the surface of the sample, and the input end of the collection fiber each provide a conjugate plane.

In another embodiment, the lens is a positive lens that cancels the aberration introduced by the window.

In another embodiment, the reflectometer or ellipsometer integrated with the processing tool also includes a first polarizing element arranged between the aperture plate and the prism mirror. The first polarizing element is configured to filter the measurement beam and the reference beam based on polarization. A second polarizing element is arranged between the prism mirror and the third mirror. The second polarizing element is configured to filter the reference beam and the reflected beam based on polarization. One or both polarizers can be controlled by rotation stages, measurements can be taken at many different polarization angles (3 or more) to derive reflectance of two orthogonal polarizations and the phase difference between the two orthogonal polarizations. The additional information (comparing to a single measurement parameter of reflectance) from such measurements can improve measurement sensitivity and minimize measurement error due to incoming wafer pattern variations. A first fold mirror is arranged between the prism mirror and the second mirror. The first fold mirror and the second mirror have perpendicular incident planes. The first fold mirror is configured to receive the measurement beam from the polarizing element and provide the measurement beam to the second mirror. The first fold mirror is also configured to receive the reflected beam from the second mirror and provide the reflected beam to the prism mirror. A second fold mirror is arranged between the prism mirror and the third mirror. The second fold mirror and the third mirror have perpendicular incident planes. The second fold mirror is configured to receive the reference beam and the reflected beam from the prism mirror and provide the reference beam and the reflected beam to the third mirror.

In another embodiment, the detection module is a spectroscopic reflectometer or ellipsometer configured to perform pattern CD measurements.

In another embodiment, the detection module is a spectroscopic reflectometer of ellipsometer configured to perform film thickness measurements of patterned samples.

In yet another embodiment, the detection module is configured to perform process excursion detection without explicitly measuring film thickness or pattern CD.

In accordance with another embodiment, a reflectometer or ellipsometer integrated with a processing tool includes a source module configured to generate an input beam, and a first mirror arranged to receive the input beam. The first mirror is configured to collimate the input beam and direct the input beam toward an aperture plate. The aperture plate has at least two apertures. One of the at least two apertures is arranged to define a measurement beam from a portion of the input beam, and one of the at least two apertures is arranged to define a reference beam from a portion of the input beam. An optical element is arranged within an optical path of the reference beam and outside an optical path of the measurement beam. The optical element is configured to direct the reference beam toward a third mirror. A second mirror is arranged to receive the measurement beam and focus the measurement beam through a window and onto a surface of a sample. The window forms part of a chamber of the processing tool and the sample is disposed within the chamber. A lens is arranged between the second mirror and the window. The lens is configured to compensate for aberration introduced in the measurement beam by the window. At least a portion of the measurement beam is reflected from the surface of the sample as a reflected beam. The lens and the second mirror are arranged to receive the reflected beam, and the second mirror is configured to collimate the reflected beam and direct the reflected beam toward the optical element. The optical element is configured to direct the reflected beam toward the third mirror. The third mirror is arranged to receive the reference beam and the reflected beam and focus the reference beam and the reflected beam onto a collection plane. A detection module is arranged to receive the reference beam and the reflected beam. The detection module is configured to provide spectral analysis of the reference beam and the reflected beam.

In an embodiment, the input beam is a broadband input beam.

In another embodiment, the aperture plate has four apertures, and two of the four apertures are arranged to define measurement beams from portions of the input beam, and two of the four apertures are arranged to define reference beams from portions of the input beam. The optical element is configured to direct the reference beams toward the third mirror. The second optical element is configured to focus the measurement beams onto the surface of the sample, and at least portions of the measurement beams are reflected from the surface of the sample as reflected beams. The second mirror is configured to collimate the reflected beams and direct the reflected beams toward the optical element. The optical element is configured to direct the reflected beams toward the third mirror. The third mirror is arranged to receive the reference beams and the reflected beams. The reflectometer or ellipsometer integrated with the processing tool also includes a second optical element arranged to receive the reference beams and the reflected beams from the third mirror. The second optical element is configured to direct one of the reference beams and one of the reflected beams to a first collection plane, and direct the other reference beam and the other reflected beam to a second collection plane different from the first collection plane.

In another embodiment, the reflectometer or ellipsometer also includes a spinning wheel arranged downstream of the aperture plate. The spinning wheel has alternating slots for allowing the reference beam and the measurement beam to sequentially pass through the spinning wheel.

In another embodiment, the collection plane includes an input to a fiber for transporting the reference beam and the reflected beam to a detection module.

In yet another embodiment, the detection module is a dual channel spectrometer that detects the measurement beam and reference beam simultaneously. The measurement beam and reference beam are separated by a prism mirror after the third mirror and are directed onto two separate receiving fibers. The two separate receiving fibers are connected to the two input channels of the dual channel spectrometer. In such configuration, the mechanical shutter for switching between reference and measurement beams can be eliminated.

Embodiments are also directed to methods of operating the described systems. The methods may be performed by way of hardware components, a computer programmed by appropriate software, by any combination of the two, or in any other manner. Furthermore, embodiments include method features for carrying out every function of the systems.

Further aspects, advantages, and features are apparent from the claims, description, and accompanying drawings.

BRIEF DESCRIPTION OF THE DRAWINGS

The various embodiments described herein, both as to organization and method of operation, together with features and advantages thereof, can best be understood by reference to the following detailed description and accompanying drawings, in which.

Figure 1:
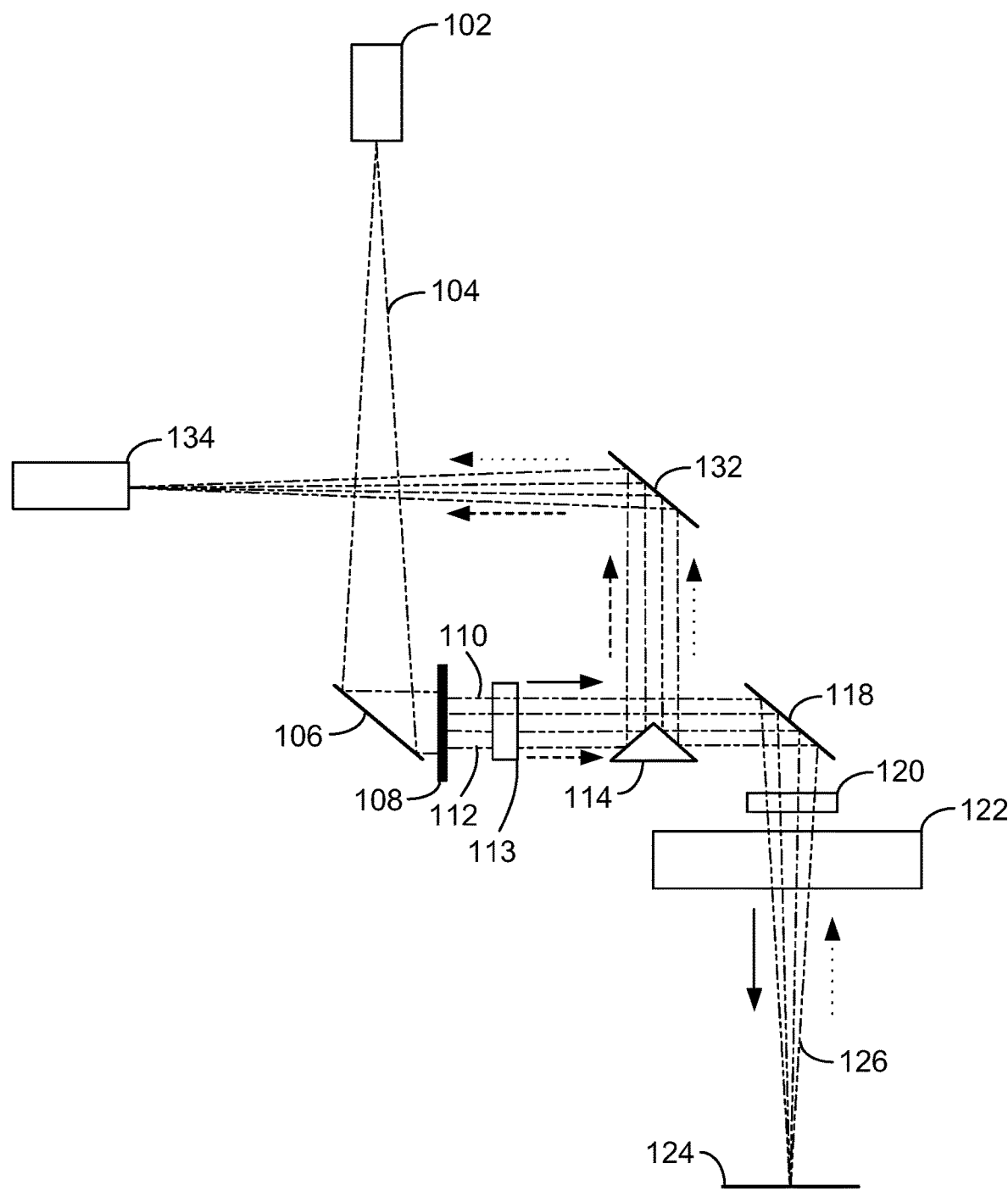
FIG. 1 is a simplified cross-sectional view of a reflectometer integrated with a processing tool in accordance with an embodiment.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the embodiments described herein. However, it should be understood that the various embodiments can be practiced without these specific details. In other instances, well-known methods, procedures, and components have not been described in detail so as not to obscure the described features.

Reference will be made in detail to the various embodiments, one or more examples of which are illustrated in the figures. Each example is provided by way of explanation and is not meant as a limitation. Further, features illustrated or described as part of one embodiment can be used on or in conjunction with other embodiments to yield yet further embodiments. The description is intended to include these modifications and variations.

A "specimen" or "sample" as referred to herein, includes, but is not limited to, a semiconductor wafer, a semiconductor work piece, a photolithography mask, a flat panel display substrate, and other work pieces such as a memory disk and the like. According to some embodiments, which can be combined with other embodiments described herein, the systems and methods are configured for or are applied to reflectometry or ellipsometry applications.

Embodiments described herein relate generally to reflectometers and ellipsometers. In accordance with an embodiment, for example, a reflectometer or ellipsometer can be integrated with a processing tool, and in some embodiments the processing tool can include a vacuum chamber for processing samples. The reflectometer or ellipsometer can provide a measurement beam that passes through a window of a processing chamber to measure a sample disposed within the chamber. The reflectometer or ellipsometer includes optical elements arranged and configured to provide a compact system that provides precise measurements.

FIG. 1 is a simplified cross-sectional view of a reflectometer or ellipsometer integrated with a processing tool in accordance with an embodiment. This example provides an optical layout of a small spot reflectometer or ellipsometer design. Input radiation is provided by a source module 102 that is configured to generate a broadband input beam 104. The broadband input beam 104 may include, for example, radiation having wavelengths ranging from about 190 nm to about 800 nm and/or about 800 nm to about 1700 nm and/or about 190 nm to about 1700 nm. The source module 102 may include an illumination fiber that is arranged to receive the broadband input beam 104 and configured to provide an optical path for the broadband input beam 104. In an embodiment, the illumination fiber may include a multi-mode fiber that has a core diameter between about 10 μm to about 600 μm. A radiation source can be placed remotely when the illumination fiber is used to relay the broadband input beam 104 to a measurement head. This can minimize the size and weight of an optics head of the reflectometer or ellipsometer.

The broadband input beam 104 is collimated by a first mirror 106 that directs the broadband input beam 104 to an aperture plate 108. The first mirror may be, for example, an off-axis parabolic mirror, a spherical mirror, and aspheric mirror, or the like. The aperture plate 108 in this example has two apertures, one for defining a measurement beam 110 associated with a solid arrow, and one for defining a reference beam 112 associated with a dashed line. The measurement beam 110 and the reference beam 112 are separated by a small distance of about 1 mm to about 3 mm. A line between of the measurement beam 110 and the reference beam 112 is aligned with optical axes of the first mirror 106 and a second mirror 118. The second mirror 118 may be, for example, an off-axis parabolic mirror, a spherical mirror, a combination of spherical mirrors and plane mirrors, an aspheric mirror, or the like.

Figure 7A:
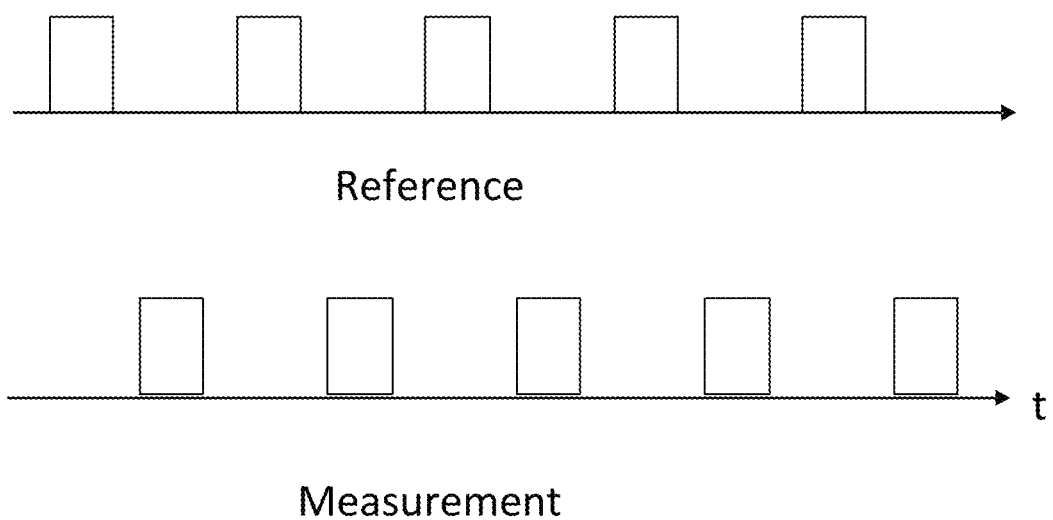
FIG. 7a provides simplified timing diagrams showing alternate blocking of a reference beam and a measurement beam.
Figure 7B:
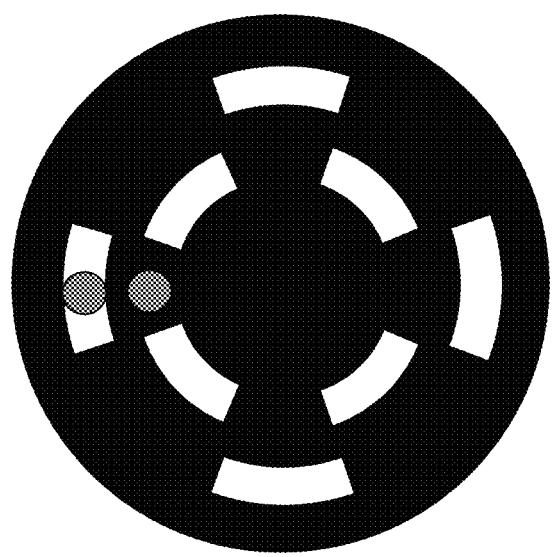
FIG. 7b is a simplified plan view of a spinning wheel having alternate slots for allowing the reference beam and the measurement beam to sequentially pass in accordance with an embodiment.

The measurement beam 110 and the reference beam 112 are directed to a switching mechanism 113 such as a flag shutter or spinning wheel (see FIGS. 7a-7b). The switching mechanism 113 allows only one beam (either the measurement beam 110 or the reference beam 112) to pass at a time. This allows the beams to be separated in time for individual analysis at a reflectometer or ellipsometer. The drift of both light source and spectrometer response can be cancelled by normalizing the measurement spectrum to the reference spectrum.

An optical element 114 is arranged within an optical path of the reference beam 112 to reflect the reference beam toward a third mirror 132. The third mirror 132 may be, for example, an off-axis parabolic mirror, a spherical mirror, and aspheric mirror, or the like. The optical element 114 may include a prism mirror or two half mirrors or other elements configured to reflect radiation. The measurement beam 110 is not reflected by the optical element 114 but instead is received by the second mirror 118 and focused through a window 122 and onto a surface of a sample 124. The window 122 forms part of a chamber of the processing tool and the sample 124 is disposed within the chamber. The window 122 is the only part of the chamber or the processing tool shown in this example.

For larger spot sizes of the measurement beam 110 (for example greater than about 100 μm) and thinner windows (for example less than a few mm), the impact of aberration introduced by the window 122 on the measurement beam 110 may be negligible. For smaller spot sizes and/or thicker windows, however, the impact of aberration introduced by the window 122 becomes more significant and may need to be corrected. A lens 120 can be used to compensate for aberration introduced by the window 122 on the measurement beam 110. Both surface curvatures of lens 120 can be optimized for a specific thickness of window 122 to cancel the aberration of window 122.

Figure 2A:
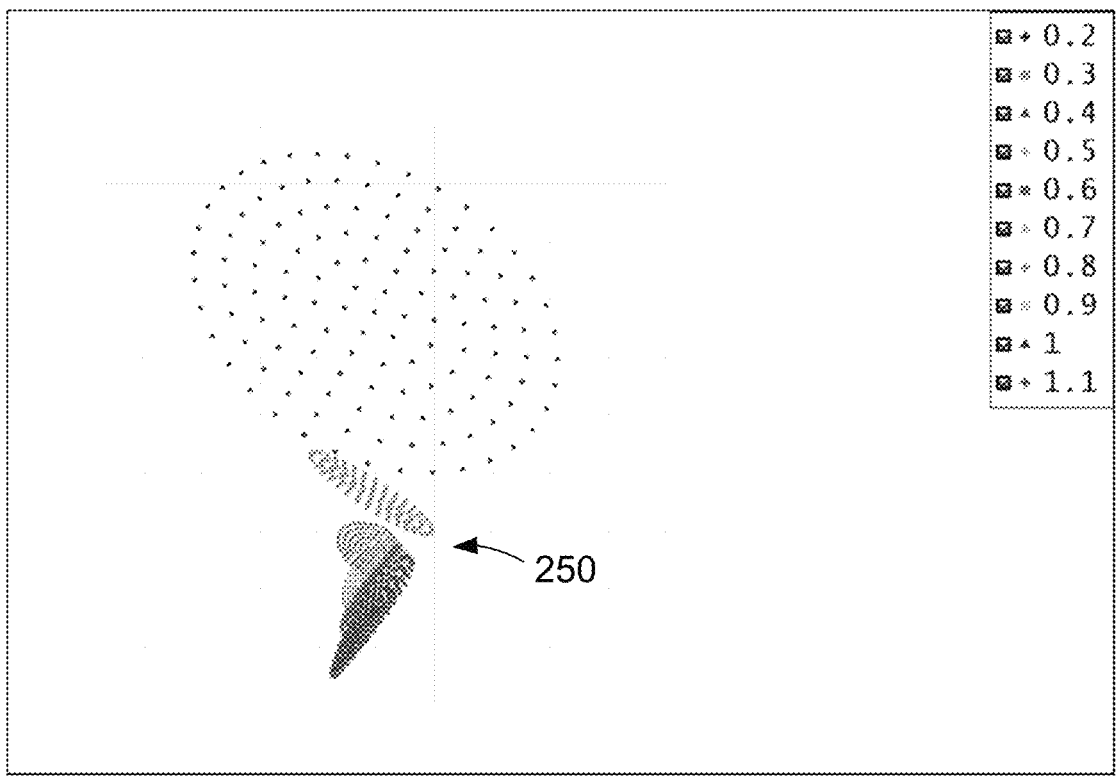
FIG. 2a is simplified plot illustrating aberration introduced in a measurement beam by a window of processing chamber.
Figure 2B:
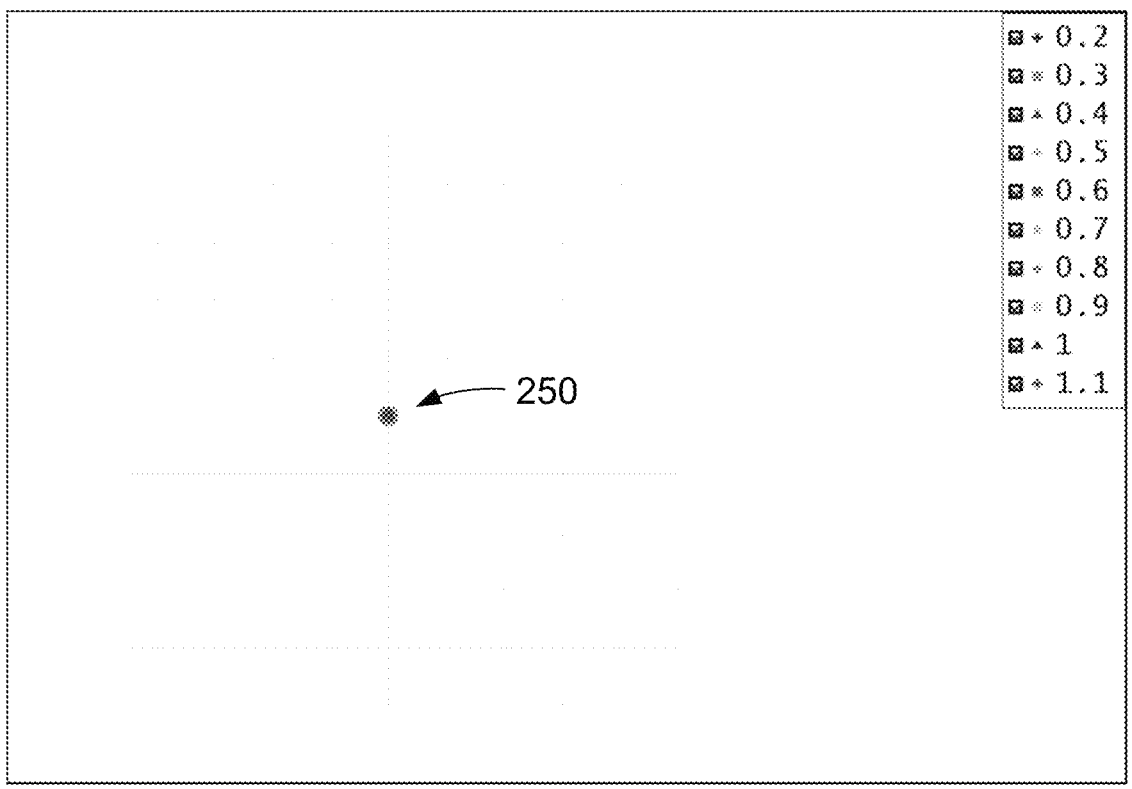
FIG. 2b is a simplified plot illustrating compensation of the aberration in accordance with an embodiment.

FIG. 2a is simplified plot illustrating aberration introduced in a measurement beam by a window without a compensating lens. This plot shows that the aberration is wavelength dependent and prevents the measurement beam from being focused into a small spot on a sample. FIG. 2b is a simplified plot illustrating compensation of the aberration using the lens 120 in accordance with an embodiment. This plot shows that the lens 120 allows the measurement beam to be focused into a small spot on the sample over a wavelength range from 200 nm to 1100 nm. The window 122 shifts the focus of longer wavelengths to shorter focal lengths and shorter wavelengths to longer focal lengths. A meniscus lens with the right surface curvatures has the opposite effect in that it shifts the focus of shorter wavelengths to shorter focal lengths and longer wavelengths to longer focal lengths. Thus, the lens 120 can be used to cancel the aberration caused by the window 122. The surface curvatures of the lens can be determined in accordance with known techniques to compensate for the aberration. More than one lens can be used to correct aberration caused by the window 122, with surface curvatures of the lenses shaped accordingly. For example, one plano-convex lens and one plano-concave lens can be configured to provide the same effect as a single meniscus lens.

The measurement beam 110 is incident on the sample 124 at a small angle of about 5° so that a reflected portion of the measurement beam is received by the second mirror 118. The reflected portion of the measurement beam 110 forms a reflected beam 126 that is associated with dotted line in this example. Because the measurement beam 110 is incident on the sample at a small angle, the reflected beam 126 passes through a different portion of the window 122 than the measurement beam 110 and is received by a different portion of the second mirror 118. The second mirror 118 collimates the reflected beam 126 and directs the reflected beam 126 toward the optical element 114.

In an embodiment, the reference beam 112 and the reflected beam 126 propagate along the same optical axis as each beam travels in opposite directions toward the optical element 114. The optical element 114 is arranged within an optical path of the reflected beam 126 and is configured to direct the reflected beam 126 toward the third mirror 132. The reference beam 112 and the reflected beam 126 may propagate along parallel paths between the optical element 114 and the third mirror 132. At least one of the first mirror 106, the second mirror 118, and the third mirror 132 may be a 90° off-axis parabolic mirror to increase working distance compared to low-angle off-axis parabolic mirrors or a dual spherical mirror design.

The third mirror 132 is arranged to receive the reference beam 112 and the reflected beam 126 and focus the reference beam 112 and the reflected beam 126 onto a detection plane at a detection module 134. The detection module 134 may include a spectrometer operating at various wavelength ranges, a dual channel spectrometer operating at the same wavelength range, a dual channel spectrometer that combines two different wavelength ranges, a multi-channel spectrometer that accept inputs from multiple optics modules, or a collection fiber may be arranged at the detection plane to receive the reference beam 112 and the reflected beam 126. A spot size of both the reference beam 112 and the reflected beam 126 at the collection plane may be approximately the same size and may overlap. Due to the switching mechanism 113, only one of the reference beam 112 or the reflected beam 126 will be incident on the detection plane at a time.

A collection fiber may be used to provide an optical path to the detection module 134. The detection module 134 measures the spectrum of light. The spot sizes of the reference beam 112 and the reflected beam 126 may be substantially smaller than the collection fiber core to maximize light efficiency and improve tolerance of optical alignment and mechanical drift.

Figure 3:
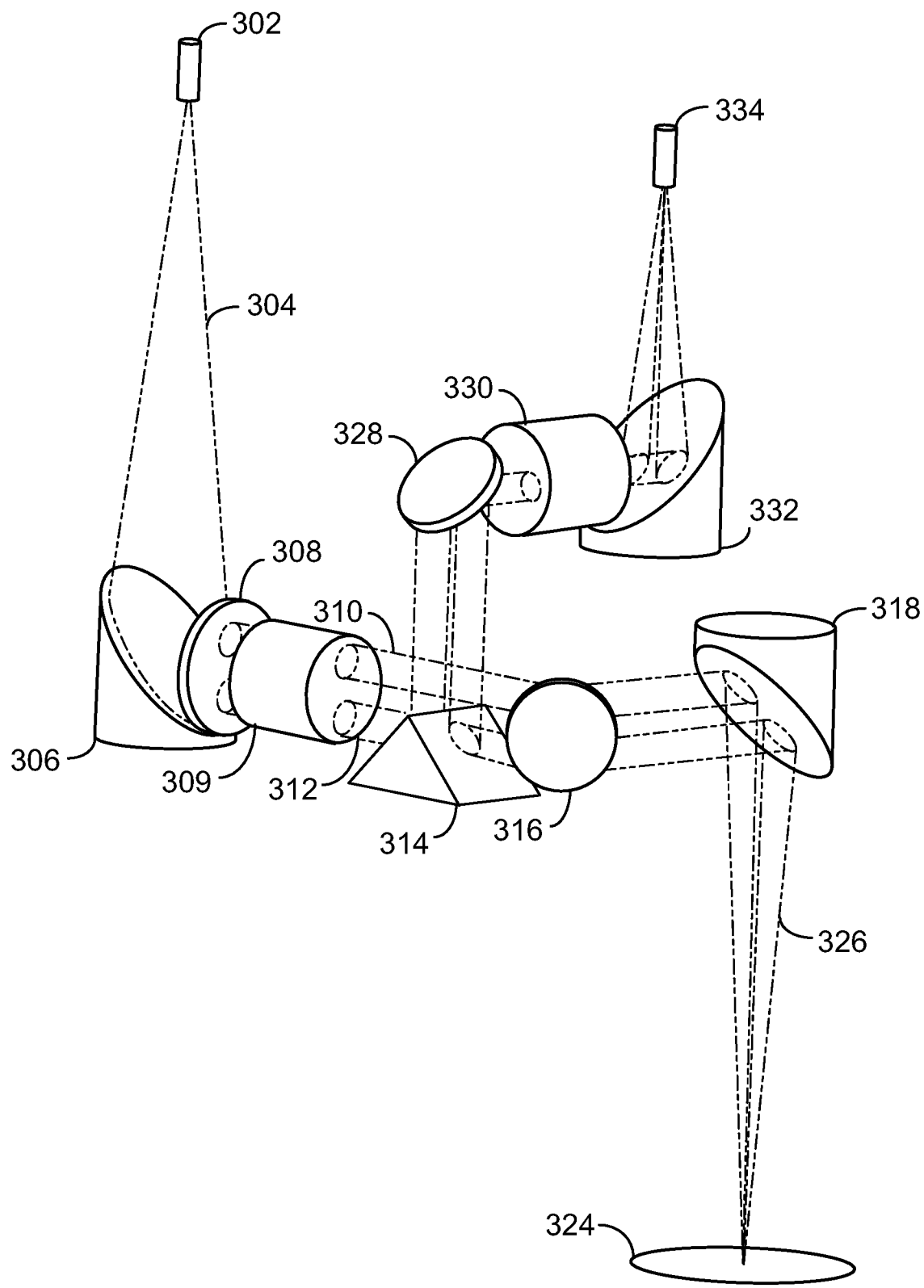
FIG. 3 is a simplified perspective view of a polarized reflectometer or ellipsometer in accordance with an embodiment.

FIG. 3 is a simplified perspective view of a polarized reflectometer or ellipsometer in accordance with an embodiment. Polarized reflectometers or ellipsometers can provide improved sensitivity for measuring patterned samples. A polarized reflectometer or ellipsometer can be implemented, for example, by inserting polarizers (e.g., polarizer 309 and 330) into a beam path.

In the example shown in FIG. 3, input radiation is provided by a source module 302 that is configured to generate an input beam 304. The input beam 304 is collimated by a first mirror 306 that directs the broadband input beam 304 to an aperture plate 308. The aperture plate 308 in this example has two apertures, one for defining a measurement beam 310, and one for defining a reference beam 312. The measurement beam 310 and the reference beam 312 pass through the polarizer 309. The polarizer 309 is configured to filter the measurement beam 310 and the reference beam 312 based on polarization. An optical element 314 is arranged within an optical path of the reference beam 312 to reflect the reference beam 312 toward a second fold mirror 328.

The measurement beam 310 is not reflected by the optical element 314 but instead is received by a first fold mirror 316 and directed to a second mirror 318. The second mirror 318 focuses the measurement beam 310 onto a surface of a sample 324. The measurement beam 310 may be focused through a window of a processing chamber and a lens may be used to compensate any aberration as described above with regard to the example shown in FIG. 1.

The reflected portion of the measurement beam forms a reflected beam 326 that is collimated by the second mirror 318. The reflected beam 326 is received by the first fold mirror 316 and directed toward the optical element 314. The optical element 314 is arranged within an optical path of the reflected beam 326 and is configured to direct the reflected beam toward the second fold mirror 328. The second fold mirror 328 directs the reference beam 312 and the reflected beam 326 through polarizer 330 and to a third mirror 332. The third mirror 332 is configured to focus the reference beam 312 and the reflected beam 326 onto a detection plane at a detection module 334. The detection module 334 may include a reflectometer, ellipsometer, or collection fiber arranged at the detection plane to receive the reference beam 312 and the reflected beam 326.

Reflection by a mirror at a large angle, such as reflection by the second mirror 318 at a 90° angle, can change a polarization state of the measurement beam 310 due to a difference in phase shift between two independent orthogonal polarizations with respect to the incident plane. The change in polarization state can be compensated by a subsequent reflection with a perpendicular incident plane so that P polarization of the first reflection becomes S polarization of the second reflection, and S polarization of the first reflection becomes P polarization of the second reflection.

The reversal of P and S polarizations of the second reflection cancels a phase shift difference between P and S polarizations of the first reflection so that the original polarization state is recovered.

Figure 4:
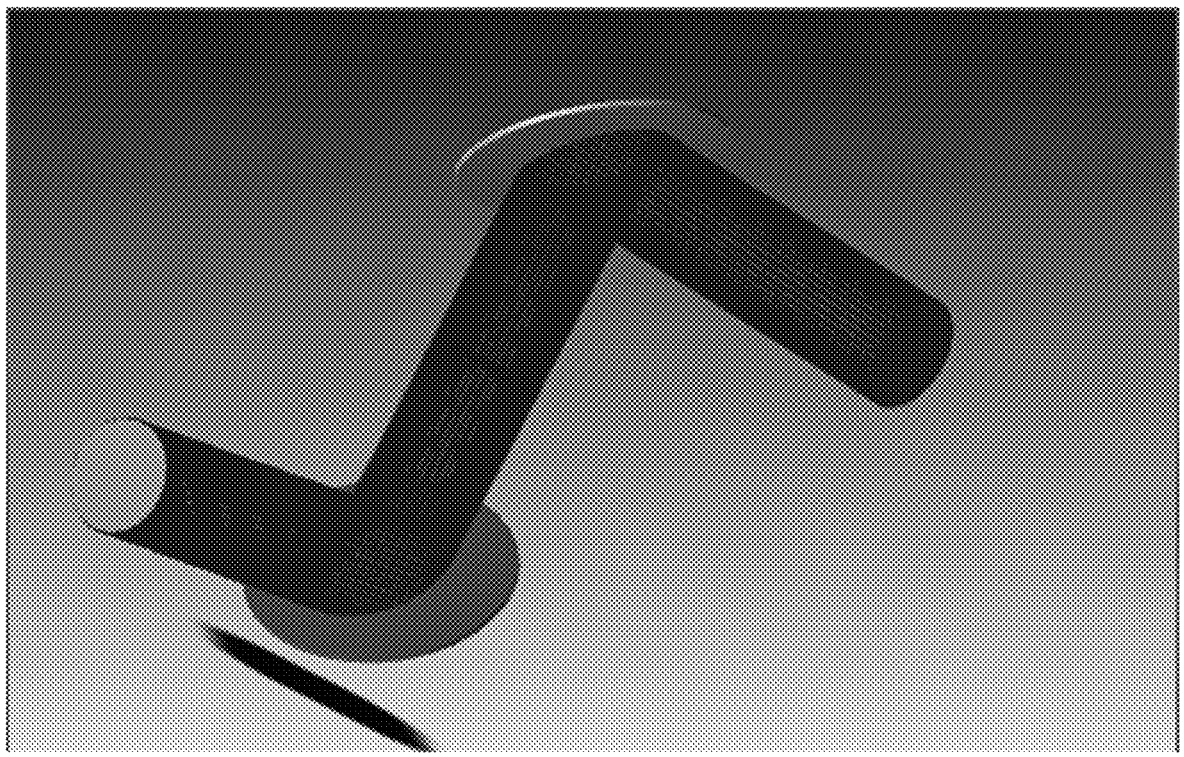
FIG. 4 is a simplified perspective view showing incident planes for canceling polarization scrambling effects in accordance with an embodiment.

FIG. 4 is a simplified perspective view showing incident planes for canceling polarization scrambling effects in accordance with an embodiment. In this figure, cross-plane fold mirrors are used to cancel the change in polarization state. Extending this to the example of FIG. 3, the first fold mirror 316 and the second mirror 318 have perpendicular incident planes to cancel the change in polarization state of the measurement beam 310, the optical element 314 and second fold mirror 328 have perpendicular incident planes to cancel the change in polarization state of the reference beam 312 and the reflected beam 326. The polarization states outside the optical paths between polarizers 309 and 330 have no impact on measurement, therefore the polarization state change caused by 306 and 332 can be ignored. This preserves the polarization states of all three beams (measurement beam 310, reference beam 312, and reflected beam 326). Preserved polarization makes it possible to measure, for example, ellipsometer signals by rotating one or both of the polarizers 309, 330.

Figure 5:
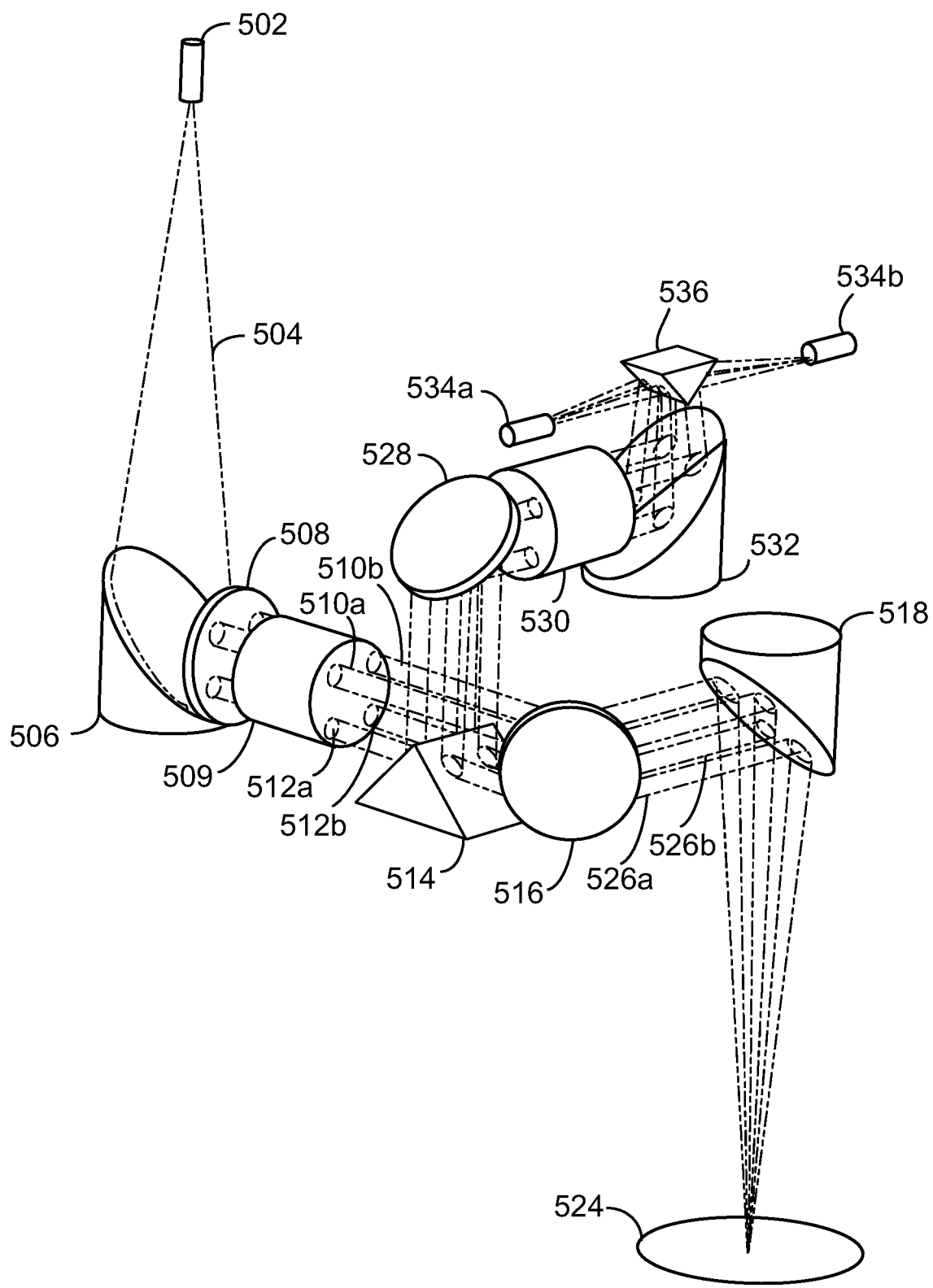
FIG. 5 is a simplified perspective view of an extended wavelength range reflectometer or ellipsometer in accordance with an embodiment.

FIG. 5 is a simplified perspective view of an extended wavelength range reflectometer or ellipsometer in accordance with an embodiment. This example combines two reflectometers or ellipsometers that have two different wavelength ranges. Merely by way of example, one reflectometer or ellipsometer may measure the wavelength range of between about 190 nm and about 800 nm, and the other reflectometer or ellipsometer may measure the wavelength range of between about 800 nm and about 1700 nm.

The example shown in FIG. 5 is similar to the example shown in FIG. 3 in that it includes a source module 502 for generating an input beam 504, a first mirror 506 for collimating the input beam 504, and an aperture plate 508. This example is different in that the aperture plate 508 defines measurement beams 510a, 510b and reference beams 512a, 512b. The measurement beams 510a, 510b and the reference beams 512a, 512b pass through a polarizer 509. An optical element 514 directs the reference beams 512a, 512b toward a second fold mirror 528.

The measurement beams 510a, 510b are received by a first fold mirror 516 and directed to a second mirror 518 where the measurement beams 510a, 510b are focused onto a surface of a sample 524. The measurement beams 510a, 510b may be focused through a window of a processing chamber and a lens may be used to compensate any aberration as described previously.

Reflected portions of the measurement beams 510a, 510b form reflected beams 526a, 526b that are collimated by the second mirror 518 and directed by the first fold mirror 516 toward the optical element 514. The optical element 514 directs the reflected beams 526a, 526b toward the second fold mirror 528. The second fold mirror 528 directs the reference beams 512a, 512b and the reflected beams 526a, 526b through polarizer 530 to a third mirror 532. The third mirror 532 is configured to focus one of the reference beams (e.g., reference beam 512a) and one of the reflected beams (e.g., reflected beam 526a) onto a detection plane at a first detection module 534a. The third mirror 532 is also configured to focus one of the reference beams (e.g., reference beam 512b) and one of the reflected beams (e.g., reflected beam 526b) onto a detection plane at a second detection module 534b. The first detection module 534a includes a spectrometer configured to measure a first wavelength range (e.g., between about 190 nm and about 800 nm), and the second detection module 534b includes a reflectometer configured to measure a second wavelength range (e.g., between about 800 nm and about 1700 nm). The first and second detection modules 534a, 534b may also include two fibers that are connected to a single dual channel spectrometer that combines two wavelength ranges.

Figure 6A:
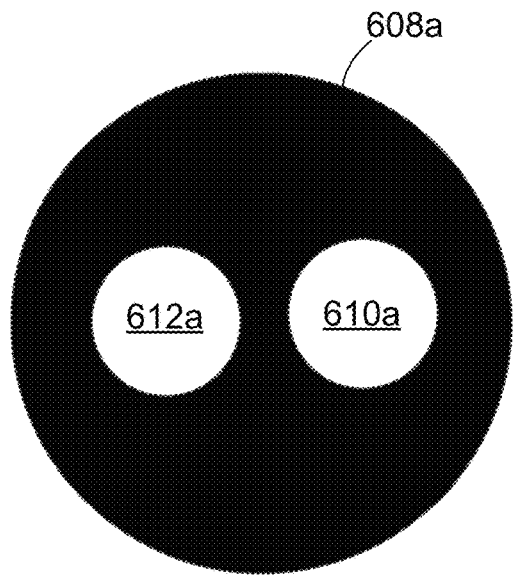
FIGS. 6a-6d are simplified plan views of aperture plates in accordance with some embodiments.

FIGS. 6a-6d are simplified plan views of aperture plates in accordance with some embodiments. As illustrated by these examples, there can be variations in the apertures that define the reference and measurement beams. In FIG. 6a, an aperture plate 608a includes two similar circles 610a, 612a that define two beams having similar shapes and sizes. In some embodiments, an attenuation filter, such as a neutral density (ND) filter, can be used to reduce an intensity of the reference beam to a similar level as the reflected beam. The reflection of some samples can be low depending on a pattern and material of the samples. Balancing an intensity of the reference and reflected beams can utilize a full dynamic range of a reflectometer or ellipsometer to maximize signal-to-noise ratio (SNR).

Figure 6B:
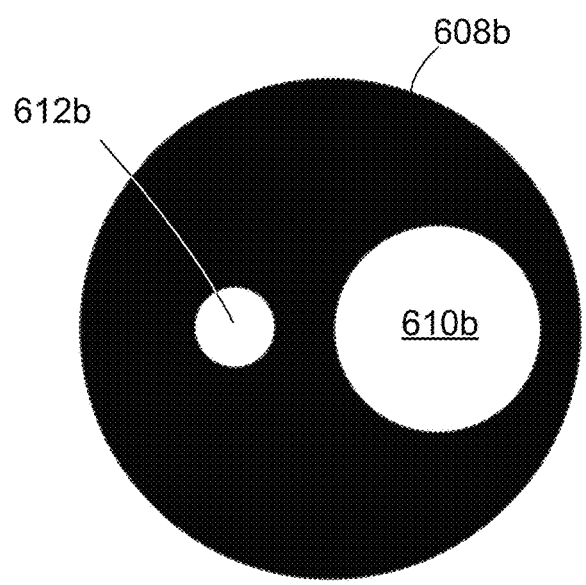

A size of the apertures can also be used to control the relative intensities of the reference and measurement beams as shown in FIG. 6b. In this example, an aperture 612b for the reference beam is smaller than an aperture 610b for the measurement beam. A spacing between the apertures may be determined by mechanical tolerance of having a spatial separation between the beams.

Figure 6C:
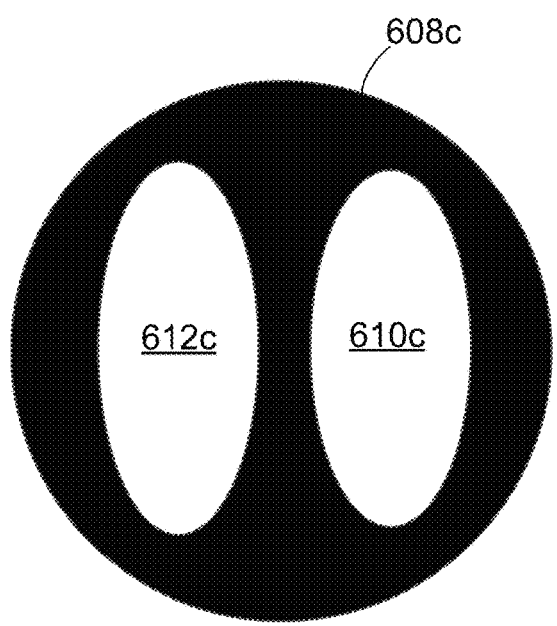

In FIG. 6c the apertures 610c, 612c are elliptical shape. This can help maintain separation between the beams while allowing more radiation to pass to improve overall radiation efficiency.

Figure 6D:
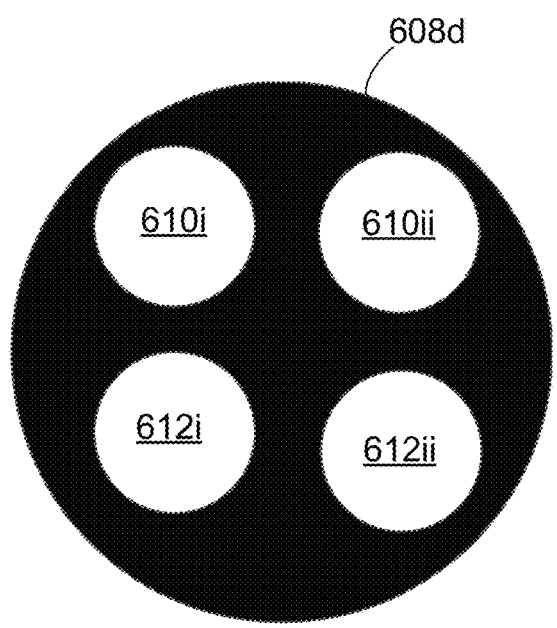

FIG. 6d shows an aperture plate 608d that includes four apertures 610i, 610ii, 612i, 612ii. The aperture plate 608d can be used with multiple reflectometer or ellipsometer systems similar to the embodiment shown in FIG. 5. Aperture plates having apertures with other shapes and sizes, as well as different numbers of apertures, may be used with the various embodiments described herein.

FIG. 7a includes simplified timing diagrams showing alternate blocking of a reference beam and a measurement beam in accordance with an embodiment. Fast switching between reference and measurement beams can improve reflectometer or ellipsometer SNR, especially in dynamic environments such as processing tools where temperatures can change quickly. Merely as an example, switching between the reference beam and the measurement beam can be controlled by a spinning wheel as shown in FIG. 7b. The spinning wheel has alternate slots for allowing the reference beam and the measurement beam to pass. A controller can detect the position of the openings on the wheel and send trigger signals to the reflectometer or ellipsometer to synchronize the beam switching with data acquisition.

Figure 8:
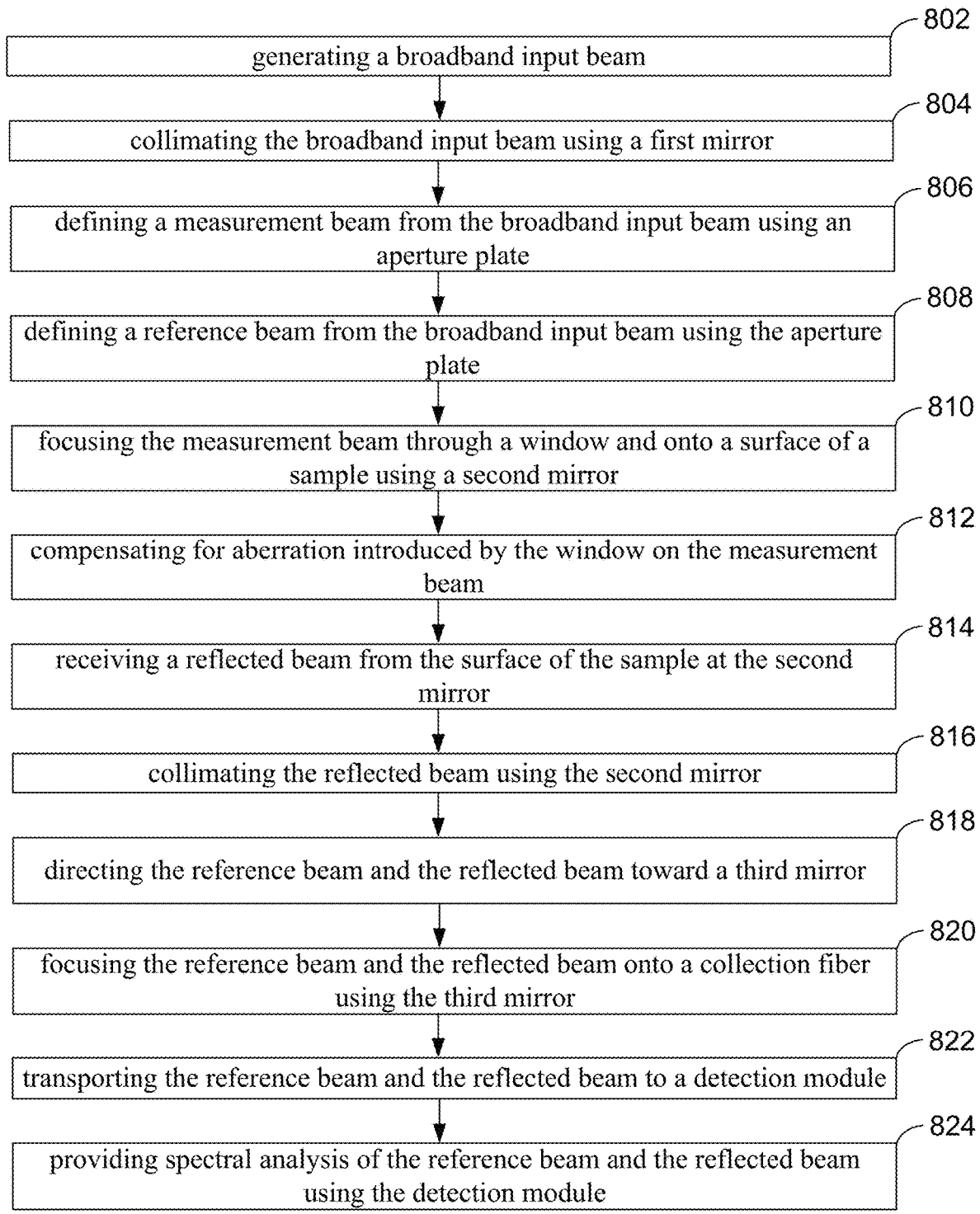
FIG. 8 is a flowchart providing a method of performing film thickness or pattern CD measurements using a reflectometer or ellipsometer integrated with a processing tool in accordance with an embodiment.

FIG. 8 is a flowchart providing a method of performing film thickness or pattern CD measurements using a reflectometer or ellipsometer integrated with a processing tool in accordance with an embodiment. The method includes generating a broadband input beam (802), collimating the broadband input beam using a first mirror (804), defining a measurement beam from the broadband input beam using an aperture plate (806), and defining a reference beam from the broadband input beam using the aperture plate (808). The measurement beam is focused through a window and onto a surface of a sample using a second mirror (810). The window forms part of a chamber of the processing tool and the sample is disposed within the chamber.

The method also includes compensating for aberration introduced by the window on the measurement beam (812), receiving a reflected beam from the surface of the sample at the second mirror (814), collimating the reflected beam using the second mirror (816), and directing the reference beam and the reflected beam toward a third mirror (818). The reference beam and the reflected beam are focused onto a collection fiber using the third mirror (820).

The method also includes transporting the reference beam and the reflected beam to the detection module (822) and providing spectral analysis of the reference beam and the reflected beam using the detection module (824).

It should be appreciated that the specific steps illustrated in FIG. 8 provide a particular method for performing reflectometry or ellipsometry measurements according to an embodiment. Other sequences of steps may also be performed according to alternative embodiments. For example, alternative embodiments may perform the steps outlined above in a different order. Moreover, the individual steps illustrated in FIG. 8 may include multiple sub-steps that may be performed in various sequences. Furthermore, additional steps may be added or removed depending on the particular application.

While the foregoing is directed to specific embodiments, other and further embodiments may be devised without departing from the basic scope thereof, and the scope thereof is determined by the claims that follow.

What is claimed is:

1. A reflectometer or ellipsometer integrated with a processing tool, comprising:
    a source module configured to generate a broadband input beam;
    an illumination fiber arranged to receive the broadband input beam and configured to provide an optical path for the broadband input beam;
    a first mirror arranged to receive the broadband input beam from the illumination fiber, the first mirror configured to collimate the broadband input beam and direct the broadband input beam toward an aperture plate;
    the aperture plate having at least two apertures, one of the at least two apertures arranged to define a measurement beam from the broadband input beam, and one of the at least two apertures arranged to define a reference beam from the broadband input beam;
    a prism mirror arranged within an optical path of the reference beam and outside an optical path of the measurement beam, the prism mirror configured to direct the reference beam toward a third mirror;
    a second mirror arranged to receive the measurement beam and focus the measurement beam through a window and onto a surface of a sample, the window forming part of a chamber of the processing tool and the sample disposed within the chamber;
    a lens arranged between the second mirror and the window, the lens configured to compensate for aberration introduced by the window on the measurement beam, wherein the second mirror focuses the measurement beam onto the surface of the sample at an angle so that at least a portion of the measurement beam is reflected from the surface of the sample as a reflected beam, and the reflected beam passes through different portions of the window and the lens than the measurement beam, and wherein the second mirror is arranged to receive the reflected beam, and the second mirror is configured to collimate the reflected beam and direct the reflected beam toward the prism mirror, the prism mirror arranged within an optical path of the reflected beam and configured to direct the reflected beam toward the third mirror;
    the third mirror arranged to receive the reference beam and the reflected beam and focus the reference beam and the reflected beam onto a collection fiber;
    the collection fiber arranged to receive the reference beam and the reflected beam and provide optical paths for the reference beam and the reflected beam; and
    a detection module arranged to receive the reference beam and the reflected beam from the collection fiber, the detection module configured to provide spectral analysis of the reference beam and the reflected beam.

2. The reflectometer or ellipsometer integrated with the processing tool of claim 1 wherein the first mirror, the second mirror, and the third mirror are each 90° off-axis parabolic mirrors.

3. The reflectometer or ellipsometer integrated with the processing tool of claim 1 wherein the one of the at least two apertures arranged to define the reference beam is smaller than the one of the at least two apertures arranged to define the measurement beam.

4. The reflectometer or ellipsometer integrated with the processing tool of claim 1 further comprising an attenuation filter arranged within the optical path of the reference beam to reduce an intensity of the reference beam.

5. The reflectometer or ellipsometer integrated with the processing tool of claim 1 further comprising a spinning wheel arranged downstream of the aperture plate, the spinning wheel having alternating slots for allowing the reference beam and the measurement beam to pass through the spinning wheel.

6. The reflectometer or ellipsometer integrated with the processing tool of claim 1 wherein the aperture plate has two apertures.

7. The reflectometer or ellipsometer integrated with the processing tool of claim 1 wherein the at least two apertures of the aperture plate each have an elliptical shape.

8. The reflectometer or ellipsometer integrated with the processing tool of claim 1 wherein the reference beam and the reflected beam are focused onto a same spot on the collection fiber.

9. The reflectometer or ellipsometer integrated with the processing tool of claim 1 wherein an output end of the illumination fiber, the surface of the sample, and an input end of the collection fiber each provide a conjugate plane.

10. The reflectometer or ellipsometer integrated with the processing tool of claim 1 wherein the lens is a positive lens that cancels the aberration introduced by the window.

11. The reflectometer or ellipsometer integrated with the processing tool of claim 1 further comprising:
    a first polarizing element arranged between the aperture plate and the prism mirror, the first polarizing element configured to filter the measurement beam and the reference beam based on polarization;
    a second polarizing element arranged between the prism mirror and the third mirror, the second polarizing element configured to filter the reference beam and the reflected beam based on polarization;
    a first fold mirror arranged between the prism mirror and the second mirror, the first fold mirror and the second mirror having perpendicular incident planes, the first fold mirror configured to receive the measurement beam from the first polarizing element and provide the measurement beam to the second mirror, the first fold mirror also configured to receive the reflected beam from the second mirror and provide the reflected beam to the prism mirror; and a second fold mirror arranged between the prism mirror and the third mirror, the second fold mirror and the third mirror having perpendicular incident planes, the second fold mirror configured to receive the reference beam and the reflected beam from the prism mirror and provide the reference beam and the reflected beam to the third mirror.

12. The reflectometer or ellipsometer integrated with the processing tool of claim 1 wherein the detection module is a small spot reflectometer configured to perform pattern critical dimension (CD) measurements and film thickness measurements.

13. The reflectometer or ellipsometer integrated with the processing tool of claim 1 wherein the detection module is a small spot ellipsometer configured to perform pattern critical dimension (CD) measurements and film thickness measurements.

14. The reflectometer or ellipsometer integrated with the processing tool of claim 1 wherein the detection module is configured to perform process excursion detection without explicitly measuring film thickness or pattern critical dimension (CD).

15. A reflectometer or ellipsometer integrated with a processing tool, comprising:
a source module configured to generate an input beam;
a first mirror arranged to receive the input beam, the first mirror configured to collimate the input beam and direct the input beam toward an aperture plate;
the aperture plate having at least two apertures, one of the at least two apertures arranged to define a measurement beam from a portion of the input beam, and one of the at least two apertures arranged to define a reference beam from a portion of the input beam;
an optical element arranged within an optical path of the reference beam and outside an optical path of the measurement beam, the optical element configured to direct the reference beam toward a third mirror;
a second mirror arranged to receive the measurement beam and focus the measurement beam through a window and onto a surface of a sample, the window forming part of a chamber of the processing tool and the sample disposed within the chamber;
a lens arranged between the second mirror and the window, the lens configured to compensate for aberration introduced in the measurement beam by the window, wherein at least a portion of the measurement beam is reflected from the surface of the sample as a reflected beam, and wherein the lens and the second mirror are arranged to receive the reflected beam, and the second mirror is configured to collimate the reflected beam and direct the reflected beam toward the optical element, the optical element configured to direct the reflected beam toward the third mirror;
the third mirror arranged to receive the reference beam and the reflected beam and focus the reference beam and the reflected beam onto a collection plane; and
a detection module arranged to receive the reference beam and the reflected beam, the detection module configured to provide spectral analysis of the reference beam and the reflected beam.

16. The reflectometer or ellipsometer integrated with the processing tool of claim 15 wherein the input beam is a broadband input beam.

17. The reflectometer or ellipsometer integrated with the processing tool of claim 15 wherein the aperture plate has four apertures, and two of the four apertures are arranged to define measurement beams from portions of the input beam, and two of the four apertures are arranged to define reference beams from portions of the input beam,
wherein the optical element is configured to direct the reference beams toward the third mirror,
wherein the second mirror is configured to focus the measurement beams onto the surface of the sample, and at least portions of the measurement beams are reflected from the surface of the sample as reflected beams,
wherein the second mirror is configured to collimate the reflected beams and direct the reflected beams toward the optical element,
wherein the optical element is configured to direct the reflected beams toward the third mirror,
wherein the third mirror is arranged to receive the reference beams and the reflected beams, and
wherein the reflectometer or ellipsometer integrated with the processing tool further comprises a second optical element arranged to receive the reference beams and the reflected beams from the third mirror, the second optical element configured to direct one of the reference beams and one of the reflected beams to a first collection plane, and direct the other reference beam and the other reflected beam to a second collection plane different from the first collection plane.

18. The reflectometer or ellipsometer integrated with the processing tool of claim 15 further comprising a spinning wheel arranged downstream of the aperture plate, the spinning wheel having alternating slots for allowing the reference beam and the measurement beam to pass through the spinning wheel.

19. The reflectometer or ellipsometer integrated with the processing tool of claim 15 wherein the collection plane includes an input to a fiber for transporting the reference beam and the reflected beam to a detection module.

20. A method of performing reflectometry or ellipsometry measurements using a reflectometer or ellipsometer integrated with a processing tool, the method comprising:
generating a broadband input beam;
collimating the broadband input beam using a first mirror;
defining a measurement beam from the broadband input beam using an aperture plate;
defining a reference beam from the broadband input beam using the aperture plate;
focusing the measurement beam through a window and onto a surface of a sample using a second mirror, the window forming part of a chamber of the processing tool and the sample disposed within the chamber;
compensating for aberration introduced by the window on the measurement beam;
receiving a reflected beam from the surface of the sample at the second mirror;
collimating the reflected beam using the second mirror;
directing the reference beam and the reflected beam toward a third mirror;
focusing the reference beam and the reflected beam onto a collection fiber using the third mirror;
transporting the reference beam and the reflected beam to the reflectometer or ellipsometer; and
providing spectral analysis of the reference beam and the reflected beam using the reflectometer or ellipsometer.

* * * * *